United States Patent
Konagai

(10) Patent No.: US 9,876,028 B2
(45) Date of Patent: Jan. 23, 2018

(54) SEMICONDUCTOR MEMORY DEVICE AND METHOD OF MANUFACTURING THE SAME

(71) Applicant: TOSHIBA MEMORY CORPORATION, Minato-ku (JP)

(72) Inventor: Satoshi Konagai, Kasugai (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/266,158

(22) Filed: Sep. 15, 2016

(65) Prior Publication Data

US 2017/0200735 A1   Jul. 13, 2017

Related U.S. Application Data

(60) Provisional application No. 62/276,992, filed on Jan. 11, 2016.

(51) Int. Cl.
*H01L 27/115* (2017.01)
*H01L 27/11582* (2017.01)
*H01L 27/11565* (2017.01)
*H01L 23/528* (2006.01)
*H01L 27/11563* (2017.01)
(Continued)

(52) U.S. Cl.
CPC .... *H01L 27/11582* (2013.01); *H01L 23/5283* (2013.01); *H01L 27/1157* (2013.01); *H01L 27/11524* (2013.01); *H01L 27/11551* (2013.01); *H01L 27/11553* (2013.01);
(Continued)

(58) Field of Classification Search
CPC ......... H01L 27/11582; H01L 27/11551; H01L 27/11553; H01L 27/11556; H01L 27/11524; H01L 27/11563; H01L 27/11568; H01L 27/1157
See application file for complete search history.

(56) References Cited

U.S. PATENT DOCUMENTS 7,539,056 B2   5/2009   Katsumata et al.
8,372,720 B2   2/2013   Fukuzumi et al.
(Continued)

FOREIGN PATENT DOCUMENTS

JP   2006-73635    3/2006
JP   2008-192708   8/2008
(Continued)

*Primary Examiner* — Fei Fei Yeung Lopez
(74) *Attorney, Agent, or Firm* — Oblon, McClelland, Maier & Neustadt, L.L.P.

(57) ABSTRACT

The memory string comprises: a plurality of control gate electrodes stacked on the substrate and extending in a first direction and a second direction parallel to the substrate; a semiconductor layer that has one end thereof connected to the substrate, has as its longitudinal direction a third direction perpendicular to the substrate, and faces the plurality of control gate electrodes; and a charge accumulation layer positioned between the control gate electrode and the semiconductor layer. The contact includes, in the third direction, a first portion, a second portion which is more to a substrate side than is the first portion, and a third portion which is more to the substrate side than is the second portion. A width of the second portion is larger than a width of the first portion, and larger than a width of the third portion.

10 Claims, 19 Drawing Sheets

(51) Int. Cl.
*H01L 27/11553* (2017.01)
*H01L 27/11551* (2017.01)
*H01L 27/11556* (2017.01)
*H01L 27/11524* (2017.01)
*H01L 27/1157* (2017.01)
*H01L 27/11568* (2017.01)

(52) U.S. Cl.
CPC .. *H01L 27/11556* (2013.01); *H01L 27/11563* (2013.01); *H01L 27/11565* (2013.01); *H01L 27/11568* (2013.01)

(56) References Cited

U.S. PATENT DOCUMENTS

2012/0241978 A1* 9/2012 Mino ................ H01L 27/11519
257/775
2015/0076708 A1* 3/2015 Kaneko ............ H01L 21/76885
257/774
2016/0365351 A1* 12/2016 Nishikawa ........ H01L 27/11526

FOREIGN PATENT DOCUMENTS

JP    2009-146954    7/2009
JP    2012-199381    10/2012

* cited by examiner

US 9,876,028 B2

SEMICONDUCTOR MEMORY DEVICE AND METHOD OF MANUFACTURING THE SAME

This application is based on and claims the benefit of priority from prior U.S. prior provisional Patent Application No. 62/276,992, filed on Jan. 11, 2016, the entire contents of which are incorporated herein by reference.

BACKGROUND

Field

An embodiment described herein relates to a semiconductor memory device and a method of manufacturing the same.

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment described below comprises: a memory string, the memory string comprising a plurality of memory cells connected in series; and a contact electrically connected to one end of the memory string via a semiconductor substrate. The memory string comprises: a plurality of control gate electrodes stacked on the substrate and extending in a first direction and a second direction that are parallel to the substrate; a semiconductor layer having one end thereof connected to the substrate, the semiconductor layer having as its longitudinal direction a third direction perpendicular to the substrate, and the semiconductor layer facing the plurality of control gate electrodes; and a charge accumulation layer positioned between the control gate electrode and the semiconductor layer. The contact includes, in the third direction, a first portion, a second portion which is more to a substrate side than is the first portion, and a third portion which is more to the substrate side than is the second portion. The contact, in a cross-sectional shape orthogonal to the first direction, has a width of the second portion larger than a width of the first portion, and has the width of the second portion larger than a width of the third portion.

Next, a nonvolatile semiconductor memory device according to an embodiment will be described in detail with reference to the drawings. Note that this embodiment is merely an example, and is not shown with the intention of limiting the present invention. Moreover, each of the drawings of the nonvolatile semiconductor memory device employed in the embodiment below is schematic, and thicknesses, widths, ratios, and so on, of layers are different from those of the actual nonvolatile semiconductor memory device.

The embodiment below relates to a nonvolatile semiconductor memory device having a structure in which a plurality of MONOS (Metal-Oxide-Nitride-Oxide-Semiconductor) type memory cells (transistors) are provided stacked in a certain direction, each of the MONOS type memory cells including: a semiconductor layer acting as a channel provided in a column shape having the certain direction as its longitudinal direction; and a gate electrode layer provided on a side surface of the semiconductor layer via a charge accumulation layer. However, this is also not intended to limit the present invention, and the present invention may be applied also to a memory cell of another form of charge accumulation layer, for example, a SONOS (Semiconductor-Oxide-Nitride-Oxide-Semiconductor) type memory cell, or a floating gate type memory cell, and so on.

First Embodiment

Figure 1:
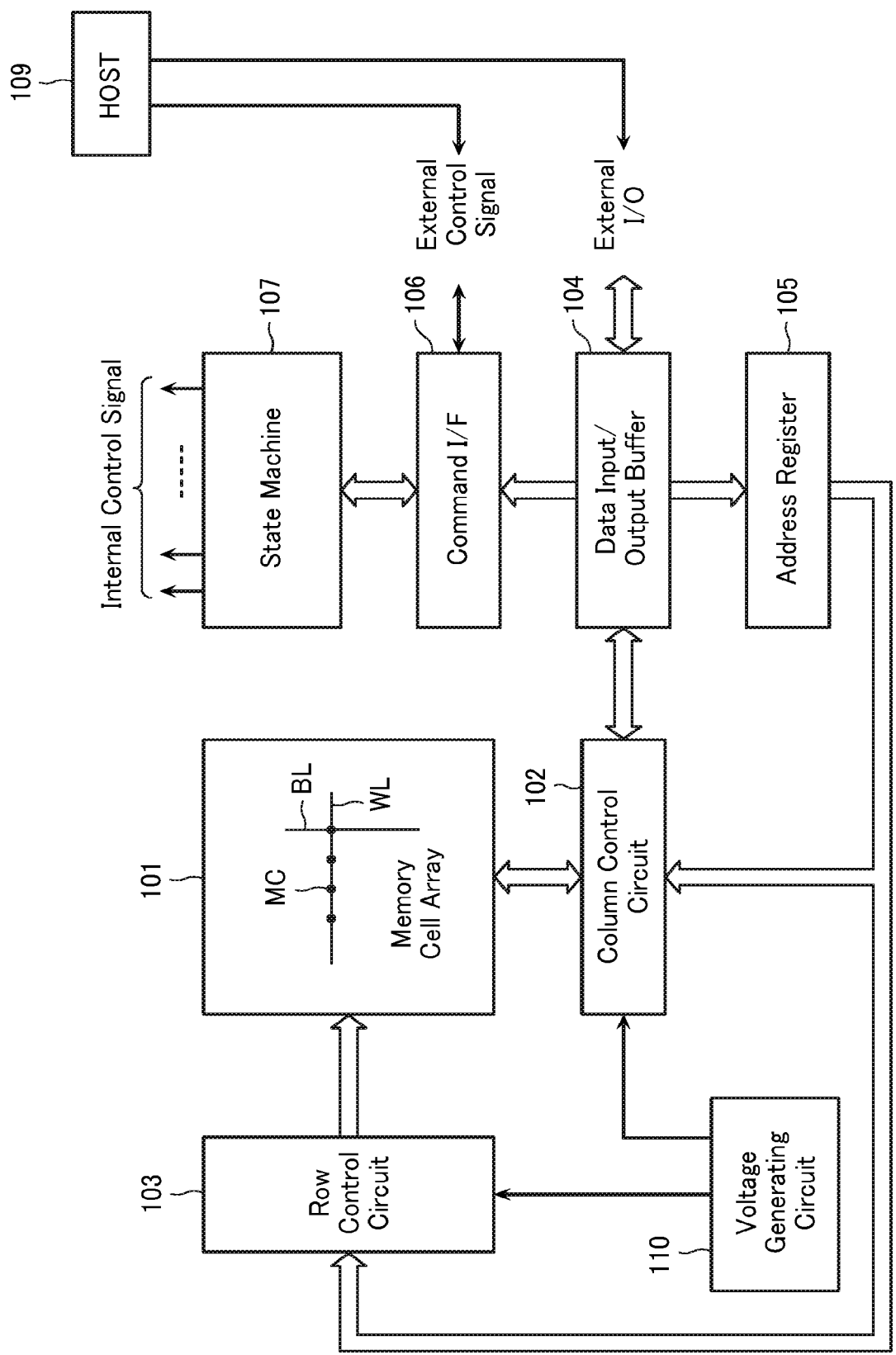
FIG. 1 is a block diagram of a nonvolatile semiconductor memory device according to a first embodiment.

FIG. 1 is a block diagram of a nonvolatile semiconductor memory device according to a first embodiment. This nonvolatile semiconductor memory device includes a memory cell array 101 comprising: a plurality of memory cells MC; and a bit line BL and a word line WL connected to these memory cells MC. Provided in a periphery of this memory cell array 101 are a column control circuit 102 and a row control circuit 103. The column control circuit 102 controls the bit line BL and performs data erase of the memory cell MC, data write to the memory cell MC, and data read from the memory cell MC. The row control circuit 103 selects the word line WL and applies a voltage for data erase of the memory cell MC, data write to the memory cell MC, and data read from the memory cell MC.

A data input/output buffer 104 is connected to an external host 109 via an I/O line, receives write data, receives an erase command, outputs read data, and receives address data or command data. The data input/output buffer 104 sends received write data to the column control circuit 102, and receives data read from the column control circuit 102 to be outputted to external. Address data supplied to the data input/output buffer 104 from external is sent to the column control circuit 102 and the row control circuit 103 via an address register 105.

Moreover, a command data supplied to the data input/output buffer 104 from the host 109 is sent to a command interface 106. The command interface 106 receives an external control signal from the host 109, determines whether data inputted to the data input/output buffer 104 is write data or command data or address data, and, if command data, receives the data and transfers the data to a state machine 107 as a command signal.

The state machine 107 performs management of this nonvolatile memory overall, receives command data from the host 109, via the command interface 106, and performs management of read, write, erase, input/output of data, and so on.

In addition, it is also possible for the external host 109 to receive status information managed by the state machine 107 and judge an operation result. Moreover, this status information is utilized also in control of write and erase.

In addition, the state machine 107 controls a voltage generating circuit 110. This control enables the voltage generating circuit 110 to output a pulse of any voltage and any timing.

Now, the pulse formed by the voltage generating circuit 110 can be transferred to any wiring line selected by the column control circuit 102 and the row control circuit 103. These column control circuit 102, row control circuit 103, state machine 107, voltage generating circuit 110, and so on, configure a control circuit in the present embodiment.

Figure 2:
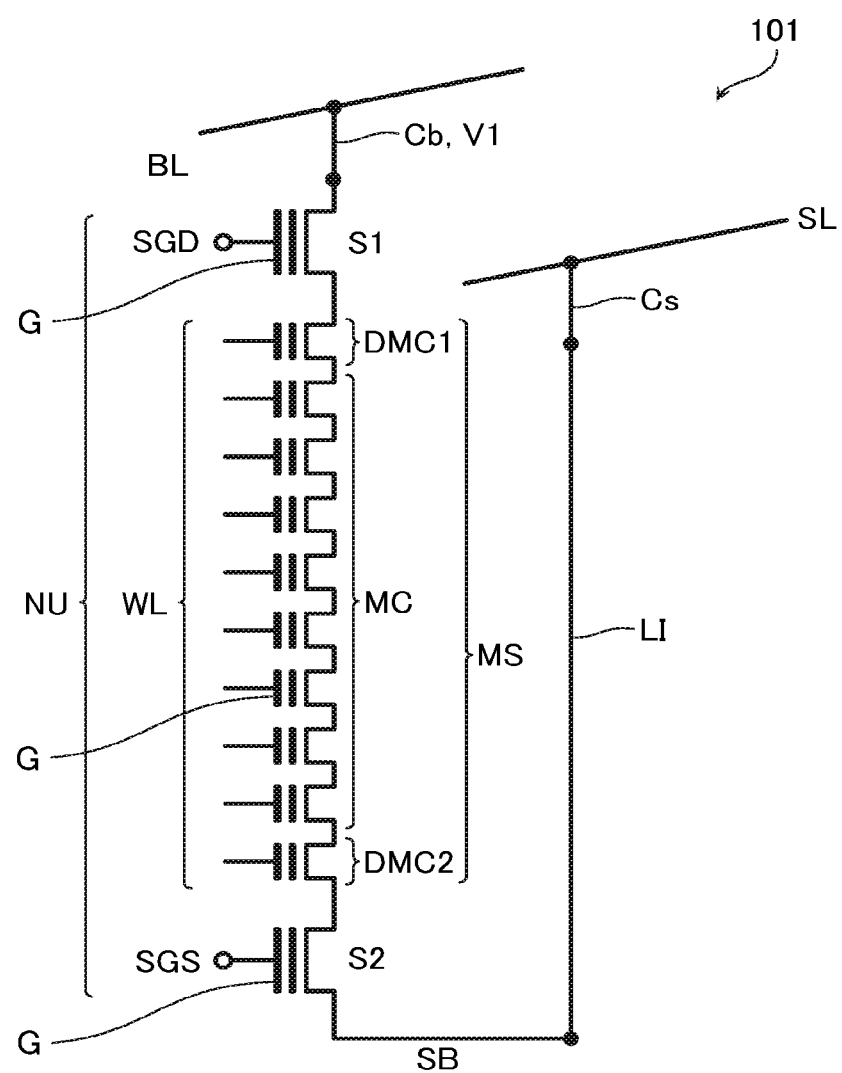
FIG. 2 is a circuit diagram showing a configuration of part of the same nonvolatile semiconductor memory device.

FIG. 2 is a circuit diagram showing a structure of part of the memory cell array 101. The memory cell array 101 according to the present embodiment comprises: a plurality of the memory cells MC connected in series; and a dummy cell DMC1 and a dummy cell DMC2 respectively connected to both ends of these memory cells MC. Control gate electrodes G of these plurality of memory cells MC and control gate electrodes G of the dummy cell DMC1 and the dummy cell DMC2 are respectively connected to the word lines WL. Moreover, these plurality of memory cells MC and the dummy cell DMC1 and dummy cell DMC2 configure a memory string MS.

A select gate transistor S1 and a select gate transistor S2 are respectively connected to both ends of the memory string MS. One end of the memory string MS is electrically connected, via the select gate transistor 82 and a semiconductor substrate SB, to a source contact LI. The other end of the memory string MS is connected, via the select gate transistor S1 and a contact Cb and contact V1, to the bit line BL. Control gate electrodes G of the select gate transistor S1 and the select gate transistor S2 are respectively connected to a drain side select gate line SGD and a source side select gate line SGS. Moreover, these memory string MS and select gate transistor S1 and select gate transistor S2 configure a NAND cell unit NU.

One end of the NAND cell unit NU is connected, via the contact Cb and the contact V1, to the bit line BL. Moreover, the other end of the NAND cell unit NU is connected, via the semiconductor substrate SB, the source contact LI, and a contact Cs, to the source line SL.

Next, a configuration of the memory cell array 101 will be described with reference to FIGS. 3 to 8.

Figure 3:
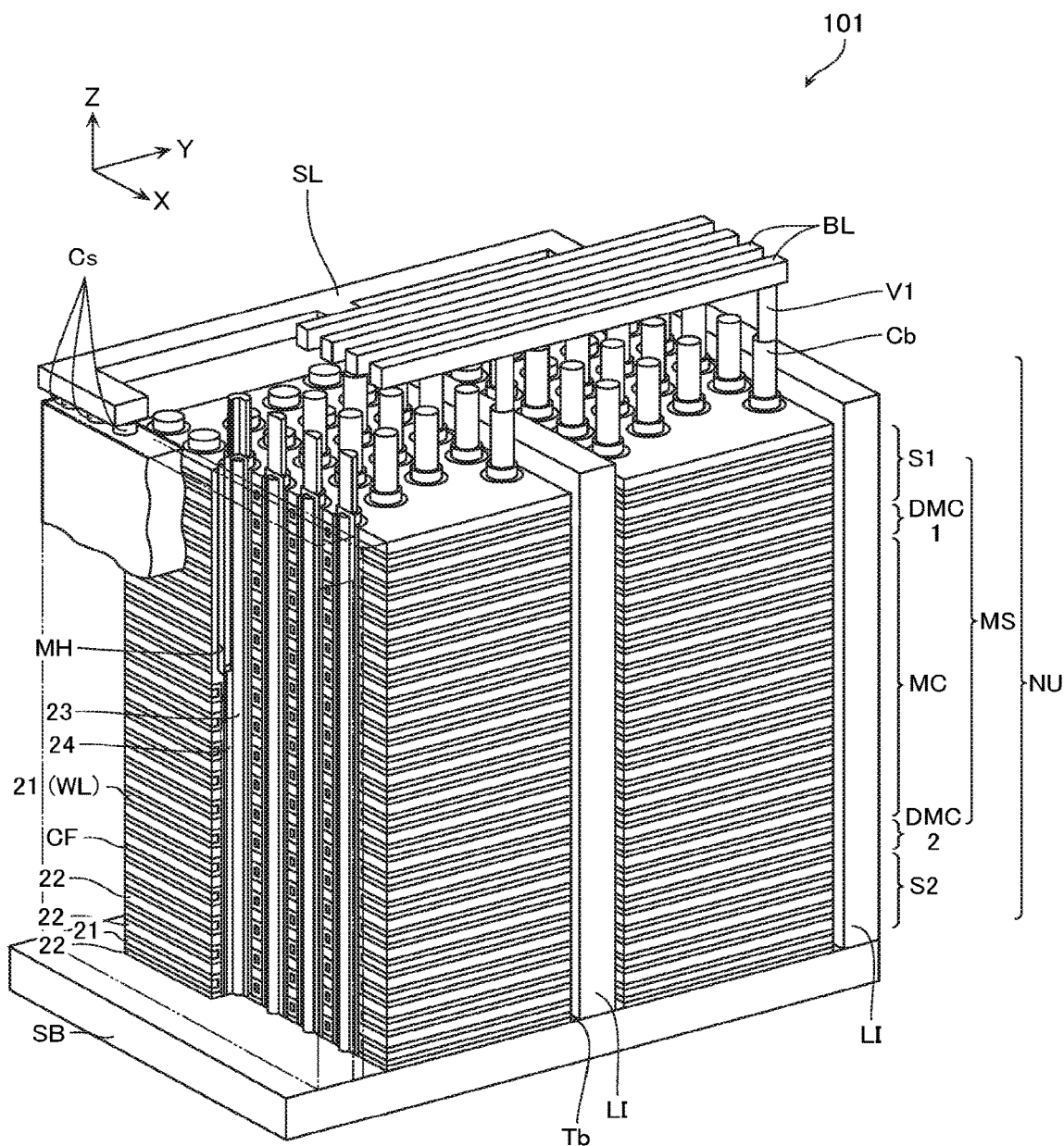
FIG. 3 is a perspective view showing a configuration of part of the same nonvolatile semiconductor memory device.

FIG. 3 is a perspective view showing a configuration of part of the memory cell array 101. The memory cell array 101 has a structure in which inter-layer insulating layers 22 and conductive layers 21 are stacked alternately on the semiconductor substrate SB. The conductive layer 21 is configured from a material having conductivity, such as a metal of the likes of tungsten (W), for example, or polysilicon to which an impurity has been added. Moreover, the inter-layer insulating layer 22 is configured from a material having insulating properties, such as silicon oxide ($SiO_2$).

A stacking film CF is formed in a periphery of the conductive layer 21. The conductive layer 21 functions as the control gate electrode G of the memory cell MC (word line WL), as the source side select gate line SGS (FIG. 2), or as the drain side select gate line SGD (FIG. 2). The control gate electrode G (word line WL) extends in a first direction (X direction) and a second direction (Y direction) that are parallel to the semiconductor substrate SB.

A memory hole MH is provided penetrating a stacked body of the conductive layers 21 and inter-layer insulating layers 22. Provided on the inside of the memory hole MH are a semiconductor layer 23 configured from the likes of polysilicon and a memory layer 24. The semiconductor layer 23 acts as a channel of the NAND cell unit NU, has as its longitudinal direction a third direction perpendicular to the semiconductor substrate SB, and faces the control gate electrode G. The semiconductor layer 23 is connected at its upper end to the bit line BL, via the contact Cb and the contact V1. The bit lines BL have the Y direction as their longitudinal direction and are arranged with a certain pitch in the X direction. Moreover, a lower end of the semiconductor layer 23 is connected to the semiconductor substrate SB.

Between the semiconductor layer 23 and the control gate electrode G is the memory layer 24 that includes a charge accumulation layer 242 (not illustrated in FIG. 3). By applying a certain voltage to a selected bit line BL and word line WL, an accumulated amount of charge to the charge accumulation layer 242 between the semiconductor layer 23 and the control gate electrode G, changes. A magnitude of this accumulated amount of charge can be detected as a change in threshold value of the transistor, whereby write, erase, and read of data are enabled.

The stacked body of the conductive layers 21 and inter-layer insulating layers 22 is divided in the second direction (Y direction) via a trench Tb. Moreover, the source contact LI is provided on a sidewall of the trench Tb via an inter-layer insulating layer LII not illustrated in FIG. 3. This source contact LI is a plate-like conductor extending in the first direction (X direction) and the third direction (Z direction), and has its lower surface connected to the semiconductor substrate SB. Its upper surface is connected to the source line SL via the contact Cs.

Figure 4:
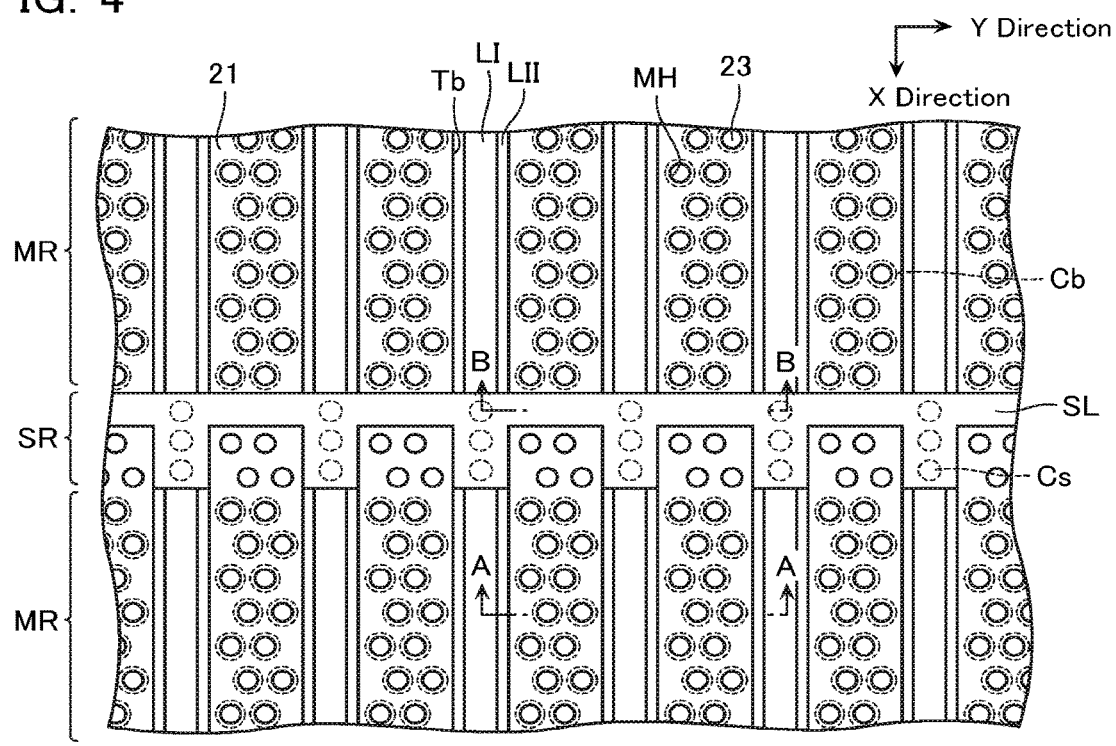
FIG. 4 is a plan view showing a configuration of part of the same nonvolatile semiconductor memory device.

FIG. 4 is a plan view showing a configuration of part of the memory cell array 101. The conductive layer 21 and the source contact LI are partitioned into a memory region MR (first region) and a source contact region SR (second region) that are adjacent in the X direction, in an XY plane. The semiconductor layer 23 is provided on the inside of the memory hole MH. The memory holes MH are arranged staggered with a certain pitch in the XY plane.

A plurality of the contacts Cb connecting the semiconductor layer 23 and the bit line BL (not illustrated), are provided in the memory region MR. The contact Cb is not provided in the source contact region SR.

A side surface of the source contact LI positioned in the source contact region SR is provided with the inter-layer insulating layer LII, and an upper surface is connected to the source line SL via the contact Cs. The contact Cs is not provided in the memory region MR.

Figure 5:
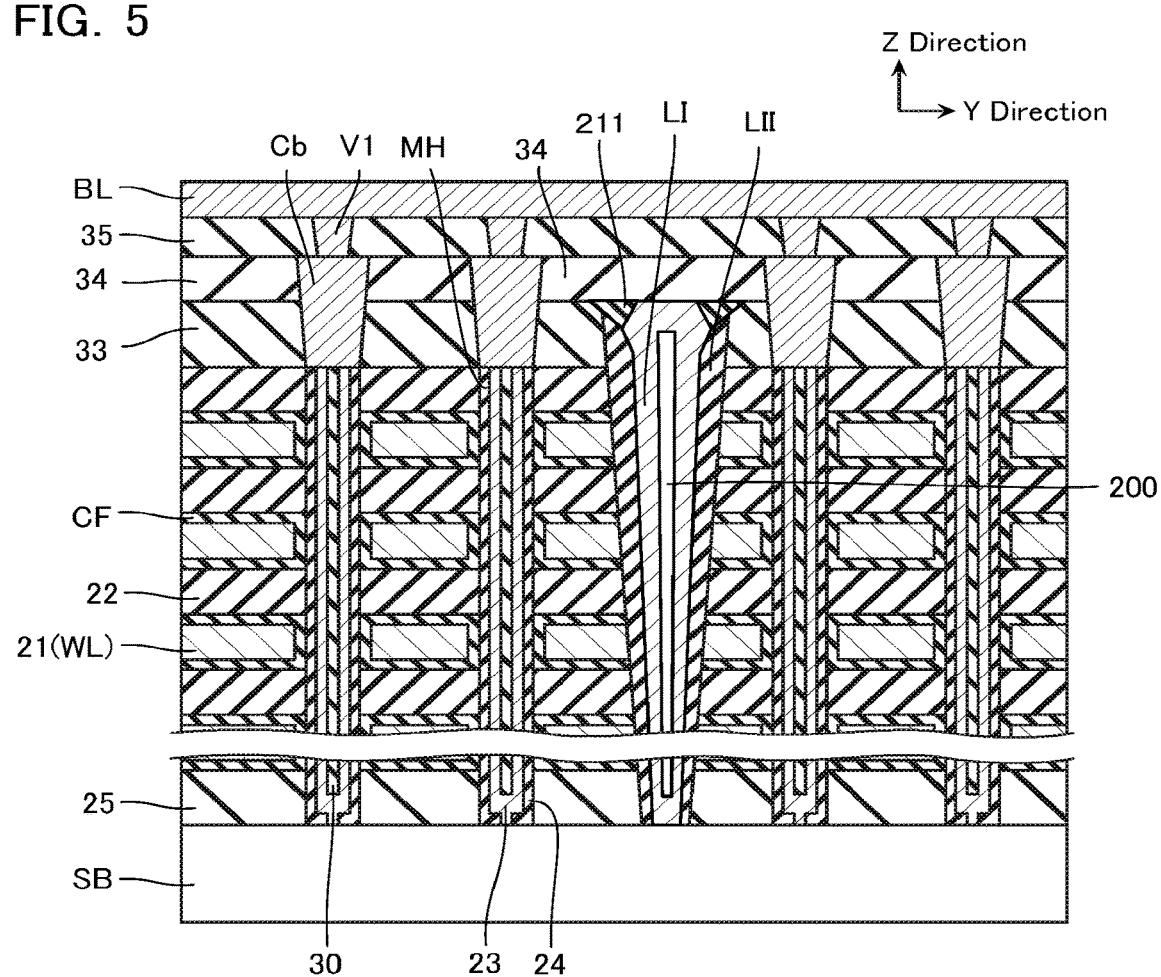
FIG. 5 is a cross-sectional view showing a configuration of part of the same nonvolatile semiconductor memory device.

FIG. 5 is a cross-sectional view showing a configuration of part of the memory cell array 101, and shows a cross-section of the portion indicated by the line A-A of FIG. 4.

Provided within the memory hole MH, sequentially from its center, are a core insulating layer 30, the semiconductor layer 23, and the memory layer 24 that have as their longitudinal direction the third direction (Z direction) perpendicular to the semiconductor substrate SB. The semiconductor layer 23 is electrically connected to the bit line BL, via the contact Cb and the contact V1.

The source contact LI, which is in a central portion of FIG. 5, is configured having tungsten (W) as its material and includes a void 200 therein, in the present embodiment. The source contact LI is electrically insulated from the conductive layer 21 (WL) by the inter-layer insulating layer LII. A lower end of the source contact LI is electrically connected to the semiconductor layer 23 within the memory hole MH, via the semiconductor substrate SB.

Figure 6:
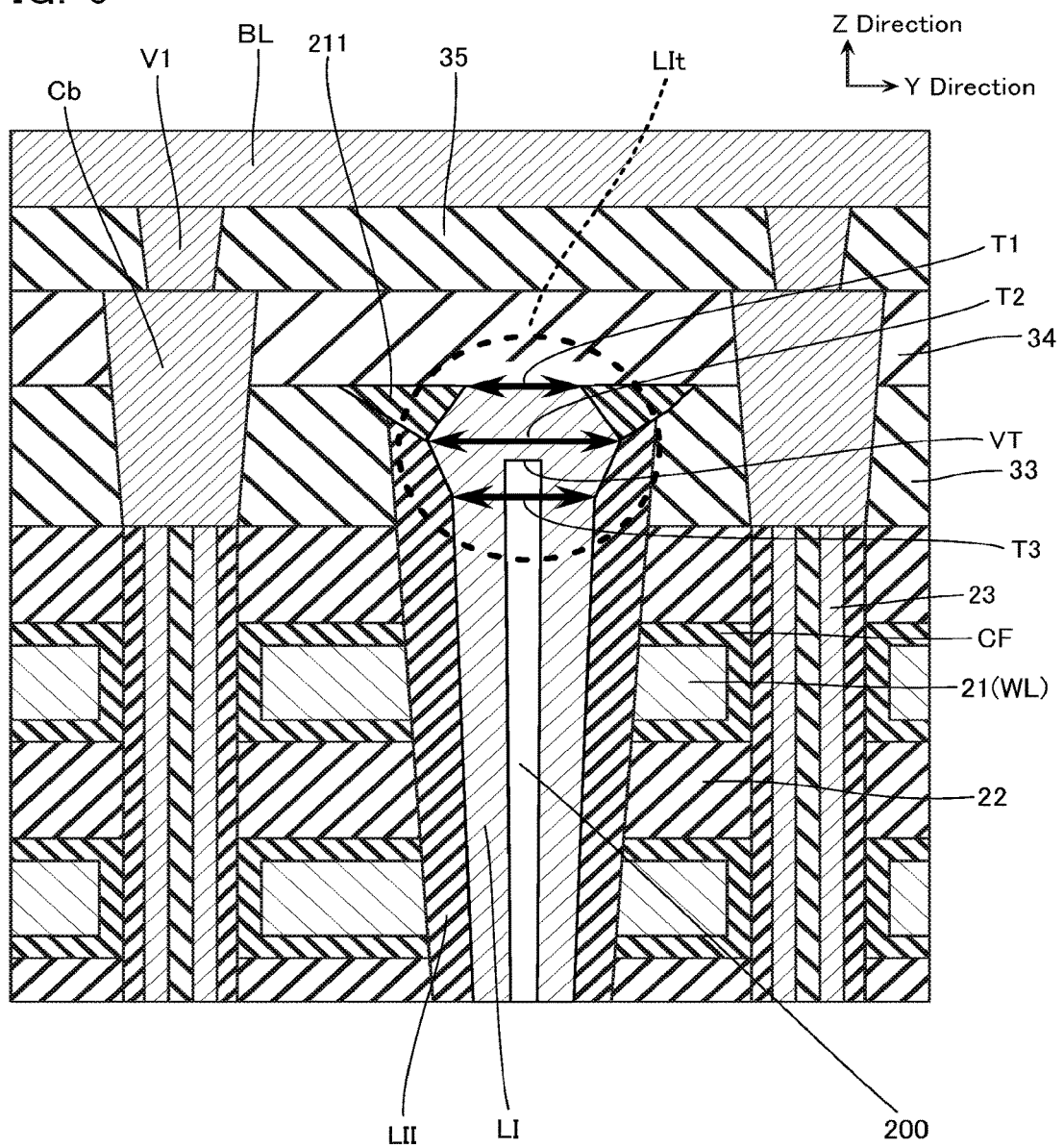
FIG. 6 is a cross-sectional view showing a configuration of part of the same nonvolatile semiconductor memory device.

FIG. 6 is a Y-Z cross-sectional view of part of FIG. 5 enlarged to explain a shape of an upper portion of the above-described source contact LI. The source contact LI has a thickness in the Y direction that differs according to a position in the Z direction, in a source contact upper portion LIt (portion surrounded by a circular dotted line). Now, in the third direction (Z direction) perpendicular to the semiconductor substrate SB, the above-described source contact upper portion LIt is considered to be divided into a first portion, a second portion which is more to a substrate side than is the first portion, and a third portion which is more to a substrate side than is the second portion. Regarding a cross-sectional shape of this source contact upper portion LIt, as shown in FIG. 6, if a width of the first portion at an upper surface of the source contact LI is assumed to be a width T1, a width in the second portion which is more to substrate side than is the first portion is assumed to be a width T2, and a width in a third portion which is even more to the substrate side than is the second portion is assumed to be a width T3, then these widths in the source contact LI have a relationship that width T2>width T1 and width T2>width T3.

Hereafter, the shape of the source contact upper portion LIt in a Y-Z cross-section of the source contact LI will be expressed as a diamond shape. As will be described in detail later, this diamond shape can be achieved by employing a method of manufacturing according to the present embodiment. A Y-Z cross-sectional shape of a source contact LIB' in a comparative example not employing this method of manufacturing has a horn shape whose width increases one-sidedly toward an upper surface. Compared to this comparative example, the diamond shape of the source contact upper portion LIt in the present embodiment has an advantage of avoiding a product defect due to short-circuiting, and so on, even when deterioration of accuracy in a manufacturing step has occurred.

Another advantage due to the method of manufacturing forming this diamond shape, will be described. As shown in FIGS. 5 and 6, a region which is a void not having been filled with a conductive material, exists in a cross-section of the source contact LI. This is indicated as the void 200. In the method of manufacturing configuring the source contact upper portion LIt as a diamond shape, the void 200 is generated inside the source contact LI and the upper end VT of the void (displayed in FIG. 6) reaches as far as the source contact upper portion LIt, that is, close to a center of the diamond shape. The void 200 has an advantage of being able to relieve stress distortion occurring in the source contact LI.

In the present embodiment, in a positional relationship in the third direction (Z direction) perpendicular to the semiconductor substrate SB, a position of the second portion of the source contact LI is positioned even more to an upper side than is an upper surface of the semiconductor layer 23 configuring the memory string MS. As a result, upper end VT of the void 200 is positioned even more to an upper side than is the upper surface of the semiconductor layer 23 configuring the memory string MS, in the third direction (Z direction) perpendicular to the substrate. The void 200 exists to be able to reduce stress distortion, and from the positional relationship in the third direction perpendicular to the substrate, of the void 200 and the memory string MS, shown in FIGS. 5 and 6, stress distortion of the memory string MS can be suitably reduced.

Figure 7:
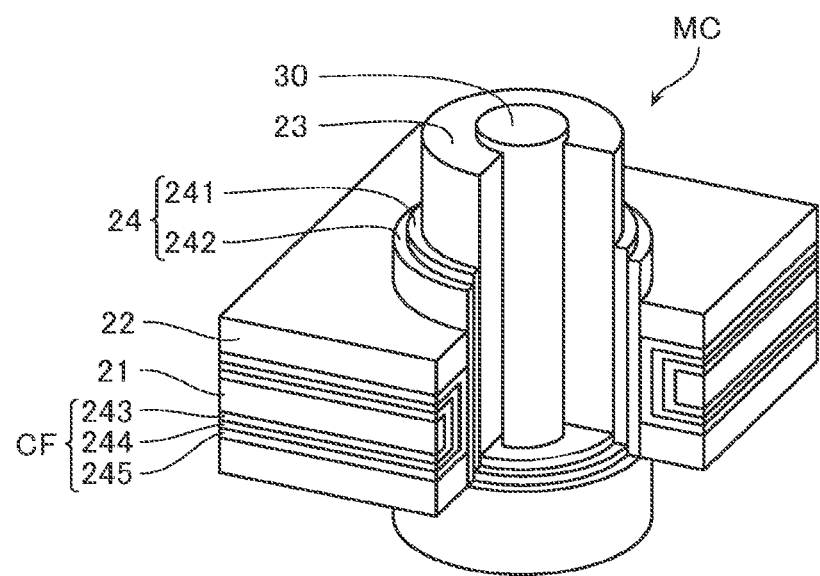
FIG. 7 is a perspective view showing a configuration of part of the same nonvolatile semiconductor memory device.

FIG. 7 is a perspective view showing part of a configuration of the memory cell MC. The semiconductor layer 23 is stacked around the core insulating layer 30, and the memory layer 24 configured by a tunnel insulating layer 241 and the charge accumulation layer 242 is further stacked on the outside of the semiconductor layer 23. The memory layer 24 faces the conductive layer 21 via the stacked film CF. This conductive layer 21 serves as the control gate electrode G. The stacked film CF comprises a barrier metal 245, a high dielectric film 244, and a block insulating layer 243 that are provided sequentially from a side surface side of the memory layer 24. Therefore, the semiconductor layer 23 faces the conductive layer 21 (control gate electrode G) via the tunnel insulating layer 241, the charge accumulation layer 242, and the stacked film CF (the barrier metal 245, the high dielectric film 244, and the block insulating layer 243).

The semiconductor layer 23 is formed from the likes of polysilicon, for example. The memory layer 24 is formed from a stacked film of, for example, silicon nitride (SiN) as the charge accumulation layer 242 and silicon oxide ($SiO_2$) as the tunnel insulating layer 241. The core insulating layer 30 is formed from, for example, silicon oxide ($SiO_2$).

The tunnel insulating layer 241 and the block insulating layer 243 are formed from, for example, silicon oxide ($SiO_2$). Moreover, the charge accumulation layer 242 is formed from, for example, silicon nitride (SiN). The high dielectric film 244 is formed from a metal oxide of the likes of alumina ($Al_2O_3$) or hafnium oxide ($HfO_x$), for example. Moreover, the barrier metal 245 is formed from a metal nitride of the likes of TiN, WN, or TaN, for example.

Figure 8:
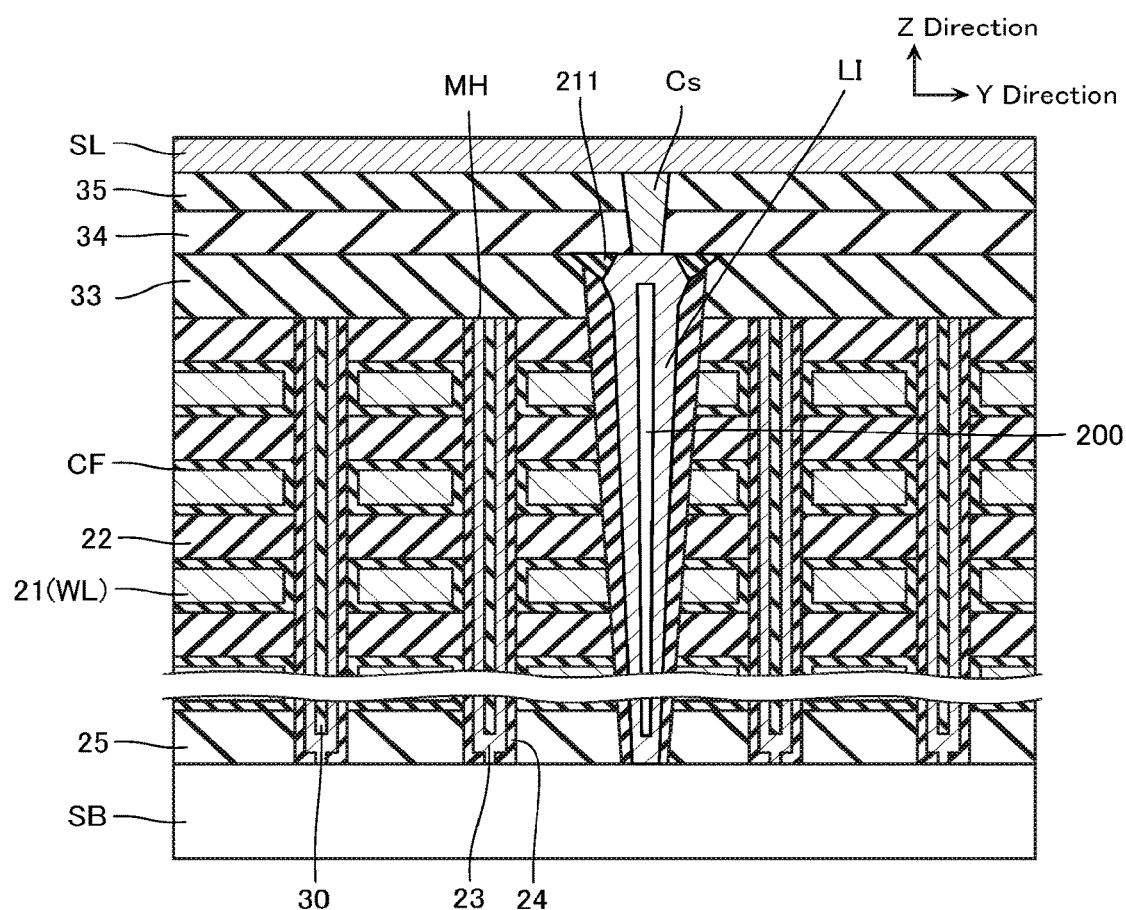
FIG. 8 is a cross-sectional view showing a configuration of part of the same nonvolatile semiconductor memory device.

FIG. 8 is a cross-sectional view at a position indicated by the line B-B of FIG. 4. The source contact LI is electrically connected to the source line SL via the contact Cs.

[Method of Manufacturing]

FIGS. 9 to 19 are cross-sectional views for explaining the method of manufacturing according to the first embodiment.

Figure 9:
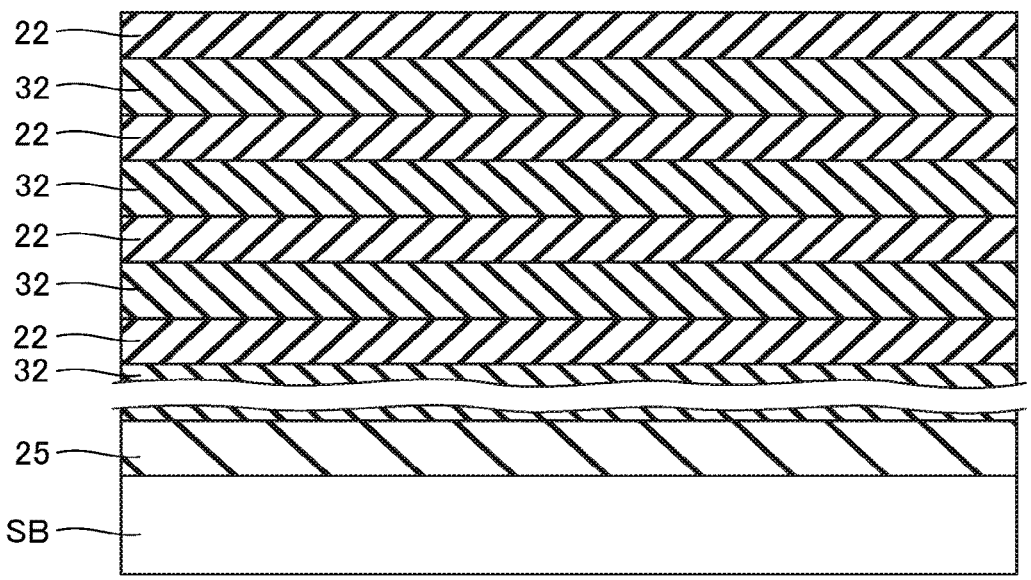
FIG. 9 is a cross-sectional view showing a manufacturing step of the same nonvolatile semiconductor memory device.

In FIG. 9, an insulating layer 25 is stacked on the semiconductor substrate SB. Furthermore, a plurality of sacrifice layers 32 and the inter-layer insulating layers 22 are alternately stacked on the insulating layer 25. Note that the insulating layer 25 and the inter-layer insulating layer 22 are formed from, for example, silicon oxide ($SiO_2$). Moreover, the sacrifice layer 32 is formed from, for example, silicon nitride (SiN).

Figure 10:
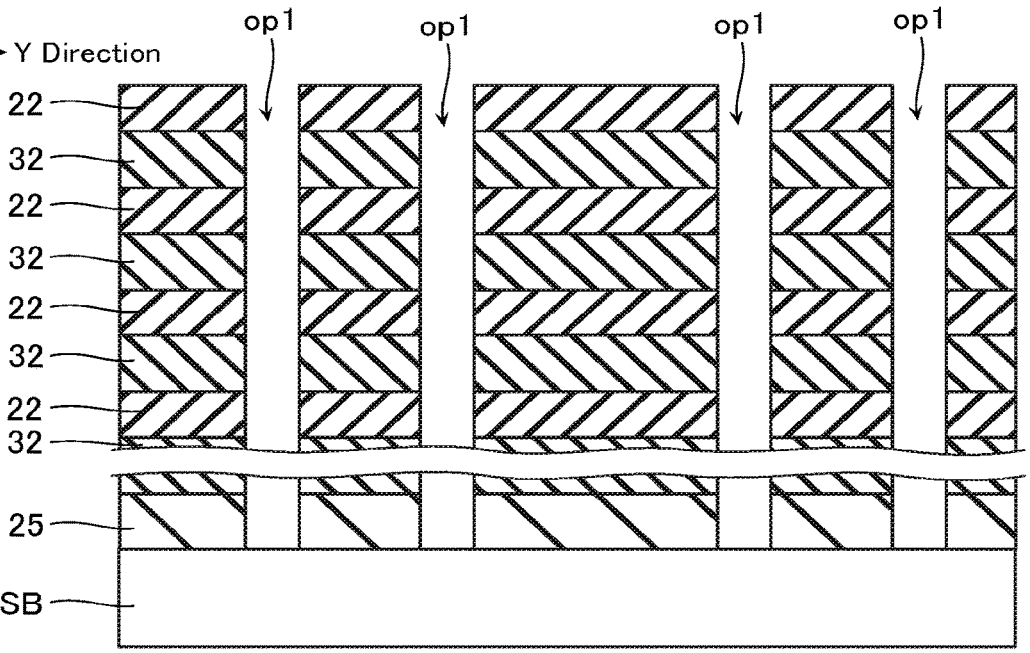
FIG. 10 is a cross-sectional view showing a manufacturing step of the same nonvolatile semiconductor memory device.

In addition, as shown in FIG. 10, an opening op1 penetrating the insulating layer 25, the sacrifice layer 32, and the inter-layer insulating layer 22, is formed. The opening op1 will be the memory hole MH. Note that in the present embodiment, the opening op1 is formed in the memory region MR described with reference to FIG. 4.

Figure 11:
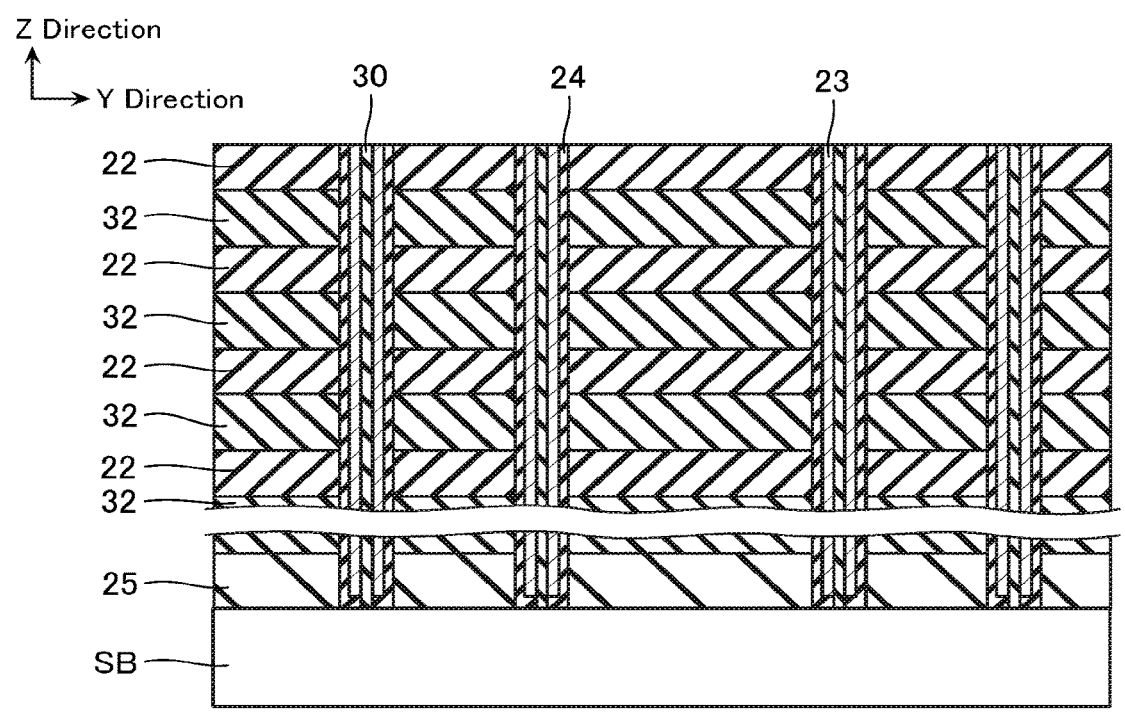
FIG. 11 is a cross-sectional view showing a manufacturing step of the same nonvolatile semiconductor memory device.

In addition, as shown in FIG. 11, the memory layer 24, the semiconductor layer 23, and the core insulating layer 30 are formed, and the memory string MS is formed. The memory layer 24 is formed as a stacked film configured from, for example, silicon nitride (SiN) as the charge accumulation layer 242 (FIG. 7) and silicon oxide ($SiO_2$) as the tunnel insulating layer 241 (FIG. 7). The semiconductor layer 23 is formed from the likes of polysilicon, for example. The core insulating layer 30 is formed from, for example, silicon oxide ($SiO_2$).

Figure 12:
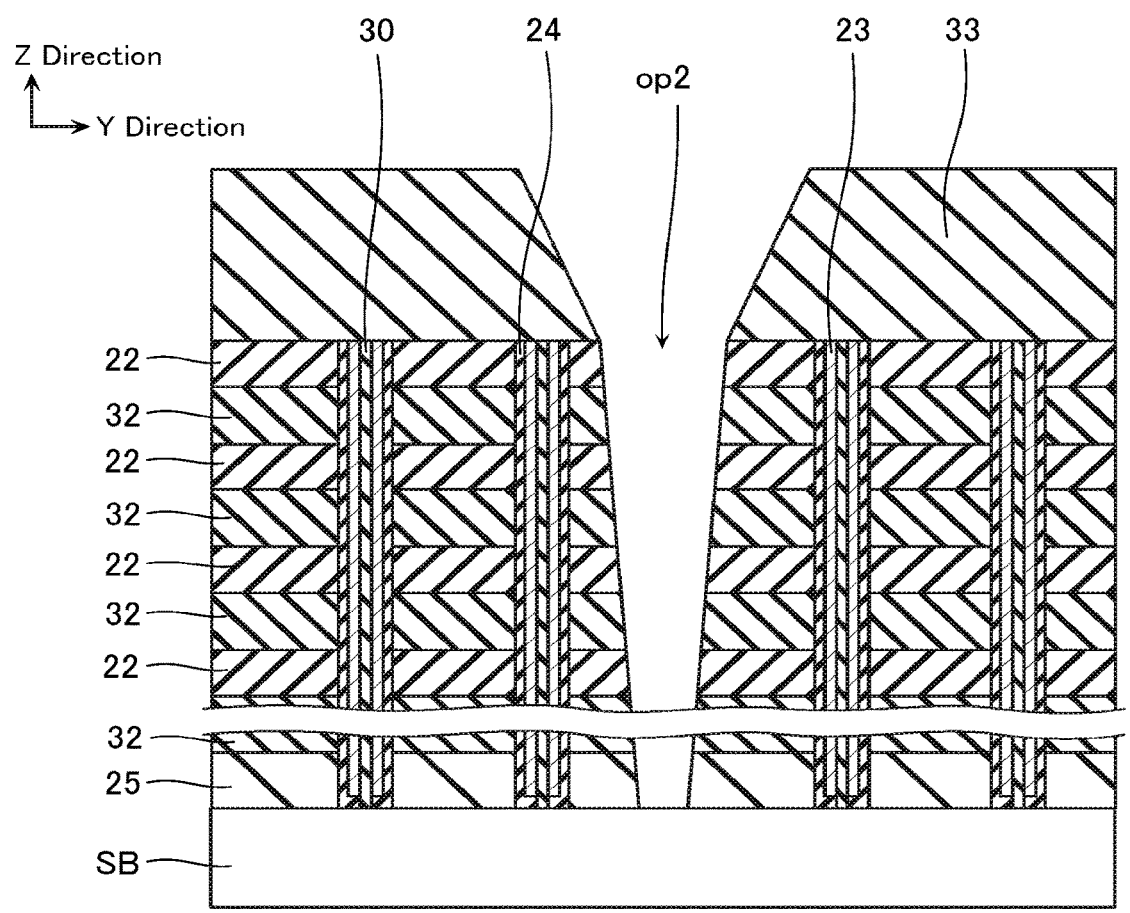
FIG. 12 is a cross-sectional view showing a manufacturing step of the same nonvolatile semiconductor memory device.

In addition, as shown in FIG. 12, a first insulating layer 33 is formed on an upper surface of the inter-layer insulating layer 22 (upper surface of the stacked body). Next, an opening op2 dividing the first insulating layer 33, the sacrifice layer 32, the inter-layer insulating layer 22, and the insulating layer 25 in the Y direction, is formed. As a result, the opening op2 has a plate-like shape extending in the third direction perpendicular to the semiconductor substrate SB and the first direction parallel to the semiconductor substrate SB. A trench within the stacked body formed by the opening op2 will be the trench Tb (FIG. 3). Moreover, the first insulating layer 33 is formed from a material such as TEOS (Tetraethyl orthosilicate), for example.

Figure 13:
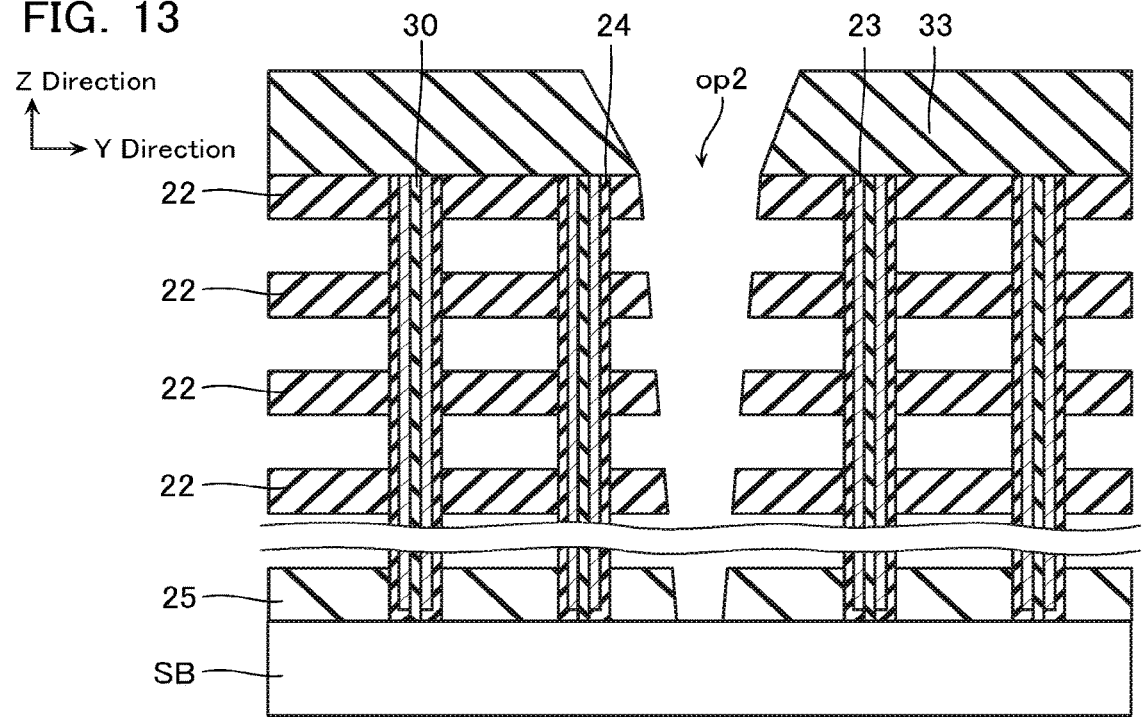
FIG. 13 is a cross-sectional view showing a manufacturing step of the same nonvolatile semiconductor memory device.

In addition, as shown in FIG. 13, the sacrifice layer 32 is removed via the opening op2. Removal of the sacrifice layer 32 is performed by, for example, wet etching using a phosphoric acid solution.

Figure 14:
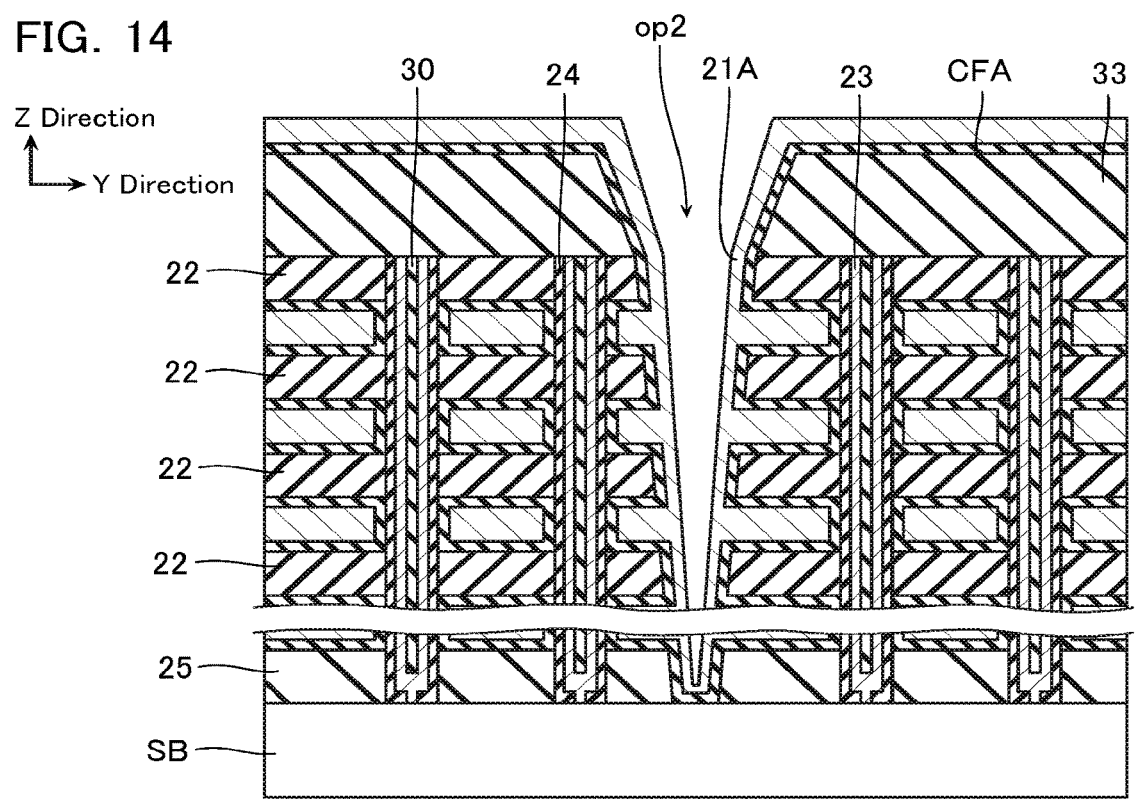
FIG. 14 is a cross-sectional view showing a manufacturing step of the same nonvolatile semiconductor memory device.

In addition, as shown in FIG. 14, a stacked film forming layer CFA which will be the stacked film CF and a conductive layer 21A which will be the conductive layer 21 (word line WL), are formed via the opening op2.

Now, in the stacked film forming layer CFA, a metal nitride of the likes of titanium nitride (TiN), tungsten nitride (WN), and tantalum nitride (TaN) is employed as the barrier metal 245 shown in FIG. 7, a metal oxide of the likes of alumina ($Al_2O_3$) and hafnium oxide (HfOx) is employed as the high dielectric film 244 shown in FIG. 7, and silicon oxide ($SiO_2$) is employed as the block insulating layer 243 shown in FIG. 7. The conductive layer 21A is formed using a metal such as tungsten (W) or using polysilicon to which an impurity has been added in high concentration.

Figure 15:
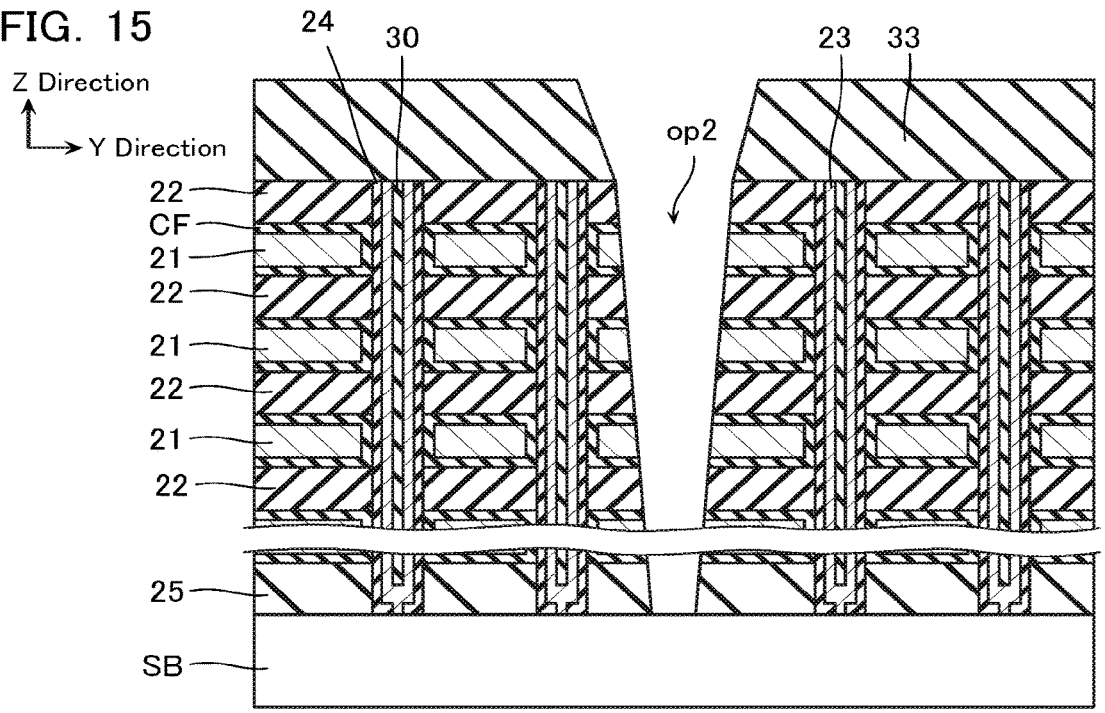
FIG. 15 is a cross-sectional view showing a manufacturing step of the same nonvolatile semiconductor memory device.

In the next manufacturing step, as shown in FIG. 15, parts of the conductive layer 21A and the stacked film forming layer CFA are removed, and the conductive layer 21A is divided in the Z direction to form the conductive layer 21 and the stacked film CF.

Figure 16:
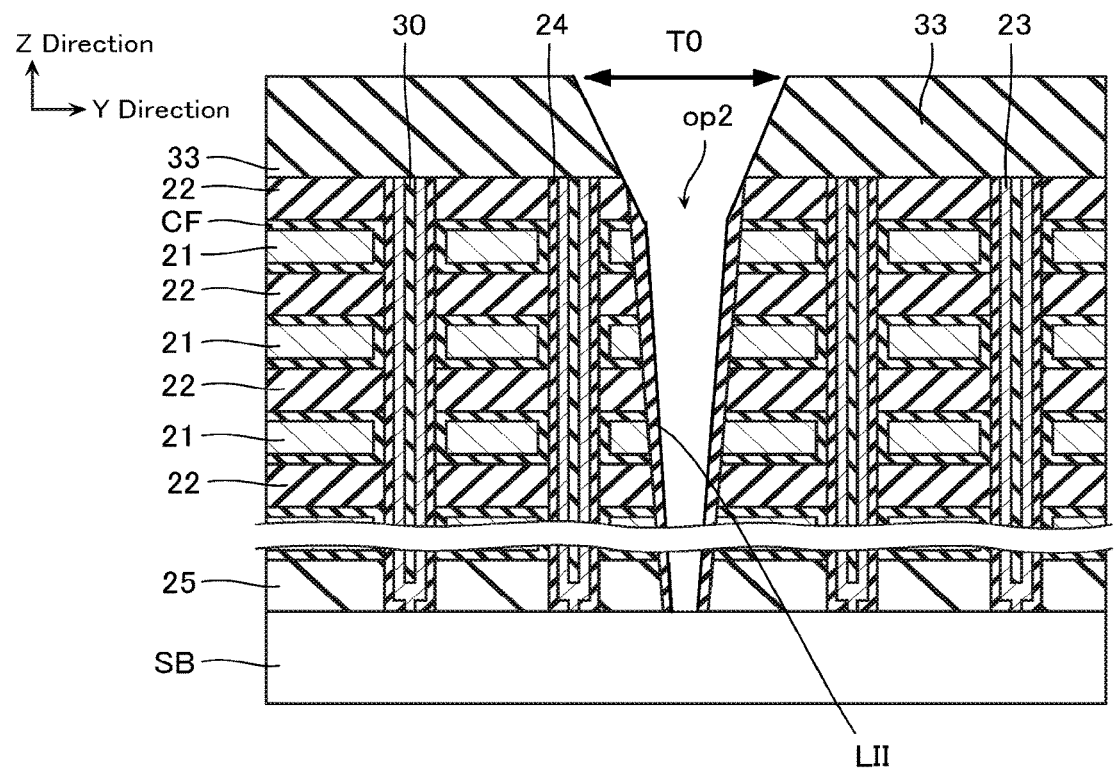
FIG. 16 is a cross-sectional view showing a manufacturing step of the same nonvolatile semiconductor memory device.

In addition, as shown in FIG. 16, the inter-layer insulating layer LII is formed in the opening op2. In formation of the inter-layer insulating layer LII, for example, silicon oxide ($SiO_2$) of a certain film thickness is deposited in the opening op2, and a portion covering a substrate SB upper surface, of the deposited silicon oxide ($SiO_2$) is removed by anisotropic etching, or the like. In this state, an opening width in the Y direction at an uppermost portion of the opening op2 is assumed to be T0.

Figure 17:
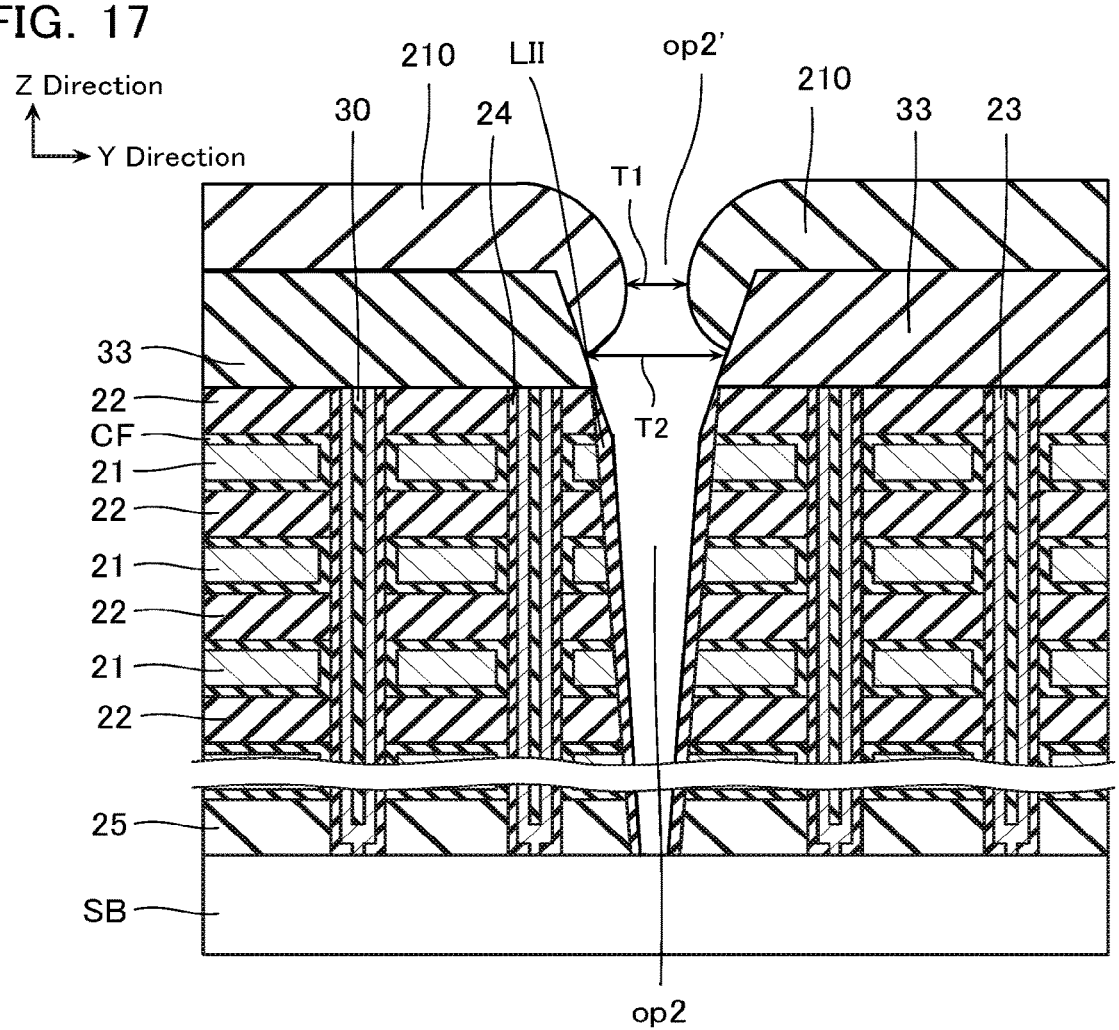
FIG. 17 is a cross-sectional view showing a manufacturing step of the same nonvolatile semiconductor memory device.

Next, as shown in FIG. 17, a second insulating layer 210 is formed on the first insulating layer 33. This second insulating layer 210 has the likes of silicon oxide ($SiO_2$) deposited using a method allowing adjustment of coverage of a formed film, such as a plasma CVD method, and covers so as to narrow an opening of an upper portion of the opening op2. Specifically, it is configured such that the upper portion of the opening op2 is not blocked and such that in the upper portion of the opening op2, the width T2 of the second portion is larger than the width T1 of the first portion positioned more upwardly than is the second portion. As a result of this manufacturing step, the upper portion of the opening op2 is reduced to an opening op2' having a narrower opening width T1.

Figure 18:
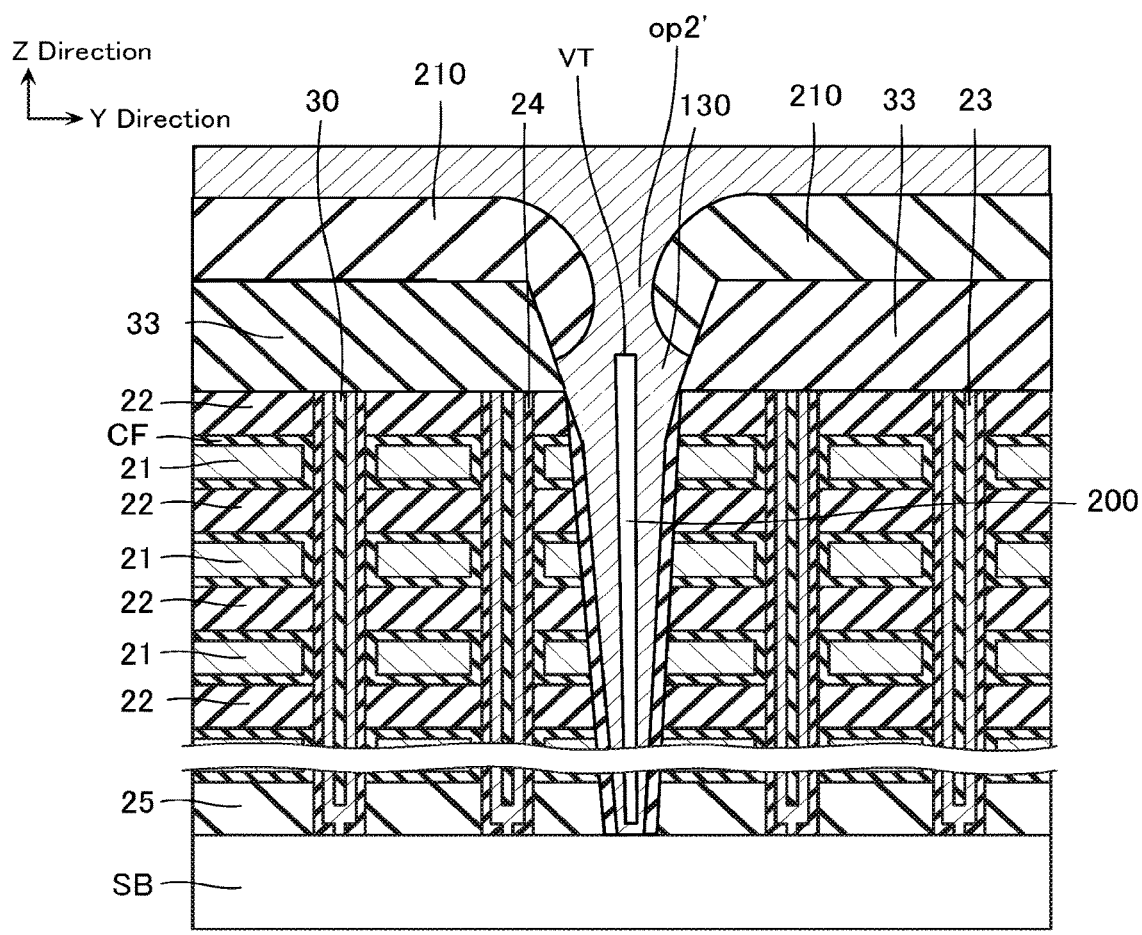
FIG. 18 is a cross-sectional view showing a manufacturing step of the same nonvolatile semiconductor memory device.
Figure 19:
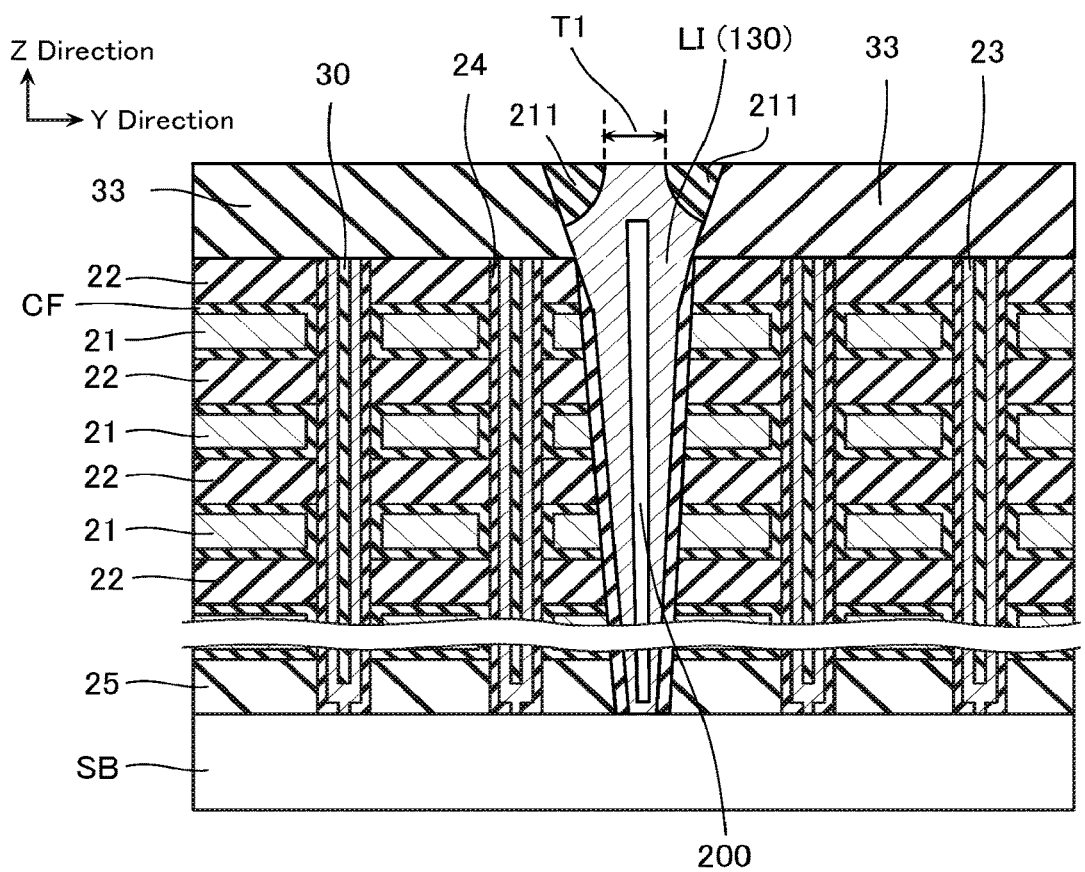
FIG. 19 is a cross-sectional view showing a manufacturing step of the same nonvolatile semiconductor memory device.

Next, as shown in FIG. 18, a metal such as tungsten (W) is implanted as a conductive layer 130 which will be the source contact LI, using a CVD method, or the like. This conductive layer 130 and the second insulating layer 210 have an unnecessary portion removed by polishing by a CMP method as will be mentioned later, whereby the source contact LI shown in FIG. 19 is completed. The diamond shape in the Z-Y cross-section of a source contact LI upper portion in FIG. 19 matches a combination of a cross-sectional shape of a portion where the second insulating layer 210 in FIG. 18 contacts the opening op2 and a cross-sectional shape determined by a spread angle of a taper of the opening op2. Therefore, this cross-sectional shape can be controlled by a process, and the diamond shape of the source contact upper portion LIt shown in FIG. 6 can be obtained.

At this time, the second portion having the width T2 (FIG. 6) in cross-section in the upper portion of the source contact LI is positioned even more to an upper side in the third direction perpendicular to the substrate SB than is the upper surface of the semiconductor layer 23 facing the plurality of control gate electrodes G.

Next, a formation mechanism of the void 200 in this manufacturing step will be described. Tungsten (W) deposition is performed via the opening op2' narrowed by the second insulating layer 210, hence, at a stage when tungsten (W) has been deposited to a certain extent on a side surface of the opening op2 positioned more to a lower side than the opening op2', the narrowed opening op2' is blocked by tungsten (W), and tungsten (W) stops being supplied to the opening op2 which is a space lower than the opening op2'.

As a result, the void 200 occurs in a central portion of the opening op2 not filled by tungsten (W). This void 200 is formed in a broad range in the Z direction. In the present embodiment, by choosing a value of an opening width of the opening op2', the upper end VT of the void 200 can be made to reach as far as close to the second portion having the width T2 in the upper portion of the source contact LI having the diamond shape shown in FIG. 6. Therefore, the upper end VT of the void 200 is positioned more to an upper side than is the upper surface of the semiconductor layer 23 in the third direction perpendicular to the semiconductor substrate SB. That is, the upper end VT of the void 200 exists more to an upper side than does an upper end of the memory string MS.

A width-of-opening w2 of this opening op2' is adjusted so as to prevent the width-of-opening w2 of the opening op2' from being narrowed whereby an opening op2' portion narrowed by the second insulating layer 210 is blocked by tungsten (W) before a required amount of tungsten (W) is supplied, and moreover, so as to prevent the width-of-opening w2 of the opening op2' from being made too broad whereby it becomes difficult for the void 200 to be formed.

Next, as shown in FIG. 19, polishing using the first insulating layer 33 as a stopper is performed using the likes of CMP, and surface tungsten (W) and a large portion of the second insulating layer 210 are removed. In this manufacturing step, a fan shaped portion lower than a surface of the first insulating layer 33, of the second insulating layer 210 remains unpolished. In FIG. 19, that remaining portion is assigned with a notation insulating layer 211. A width of an upper surface of the source contact upper portion LIt exposed from between the insulating layer 211 and the first insulating layer 33 is the width T1 mentioned in FIG. 6.

Next, in order to obtain a structure shown in the cross-sectional view of FIG. 5 indicating the A-A line cross-sectional region of FIG. 4, an insulating layer 34 and an insulating layer 35 are formed, and furthermore, a process in which the contact Cb and the contact V1 are formed for connecting the memory hole MH and the bit line BL, is performed. As a result, the cross-sectional structure shown in FIG. 5 is obtained.

Moreover, in order to obtain a structure shown in the cross-sectional view of FIG. 8 indicating the B-B line cross-sectional region of FIG. 4, a manufacturing step for connecting the source contact LI and the contact Cs and source line SL, is performed. As a result, the cross-sectional structure shown in FIG. 8 is obtained.

An upper surface of the source contact LI having the diamond shape in its upper portion formed in the present embodiment, does not extend in the Y direction, hence in a manufacturing step for creation of the contact Cb for the memory hole NH, a margin is generated in alignment accuracy. Therefore, it is difficult for contact between the contact Cb and the source contact LI to occur, and a rate of memory defects due to short-circuiting can be suitably reduced.

Moreover, the void 200 in the source contact LI configured from tungsten (W) exists in the same region as a region where the memory hole MH exists, in the Z direction. Therefore, stress distortion decreases also in the region where the memory hole MH exists, and reliability of the memory device can be suitably improved.

Comparative Example

Figure 20:
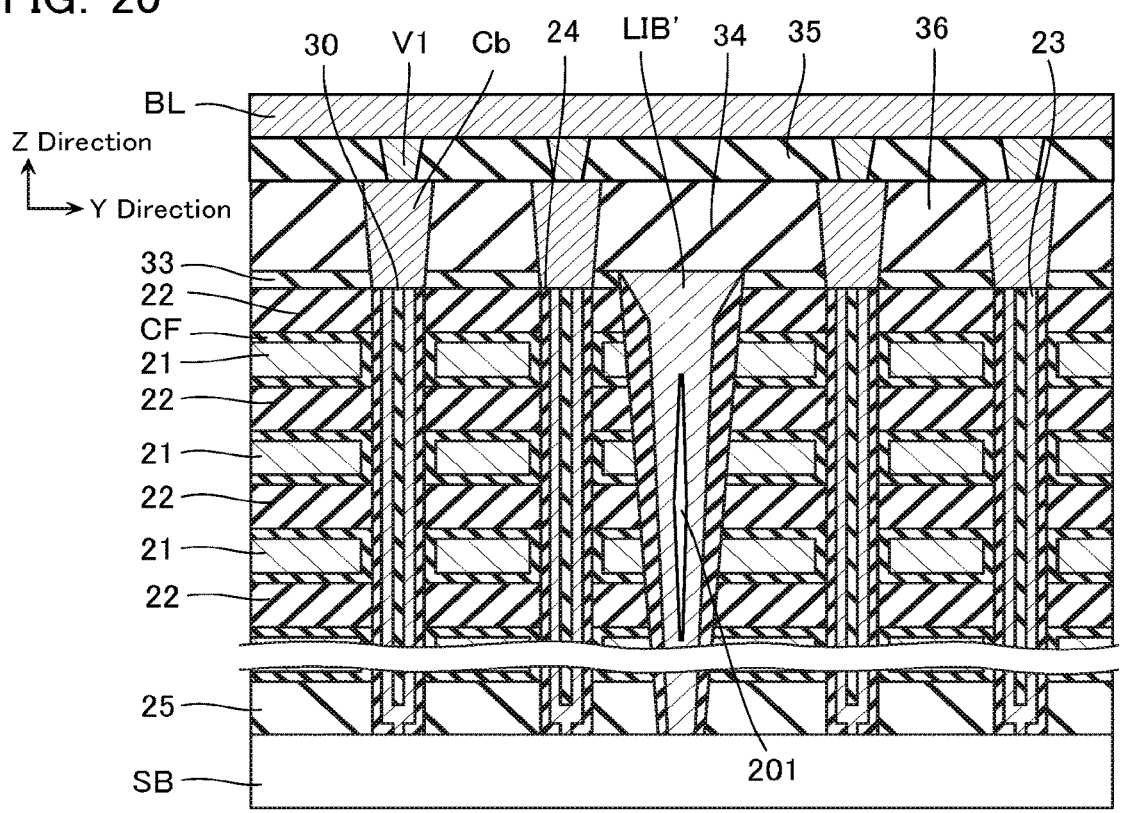
FIG. 20 is a cross-sectional view showing a configuration of part of a nonvolatile semiconductor memory device in a comparative example.

FIG. 20 is a Y-Z cross-sectional view showing a configuration of part of a nonvolatile semiconductor memory device in a comparative example, and corresponds to the region indicated by the line A-A of FIG. 4 used in the description of the present embodiment. A difference between the comparative example and the nonvolatile semiconductor memory device according to the present embodiment is that the shape in the Y-Z cross-section of the source contact upper portion LIt (FIG. 6) in the above-described embodiment is a diamond shape, whereas as shown as a source contact LIB' in FIG. 20, the shape in the Y-Z direction in the present comparative example is a horn shape extending simply in an upward direction. In the comparative example, a void 201 has a short long-and-thinness, hence a tip of the void 201 does not reach as far as an upper side of the semiconductor layer 23.

Figure 21:
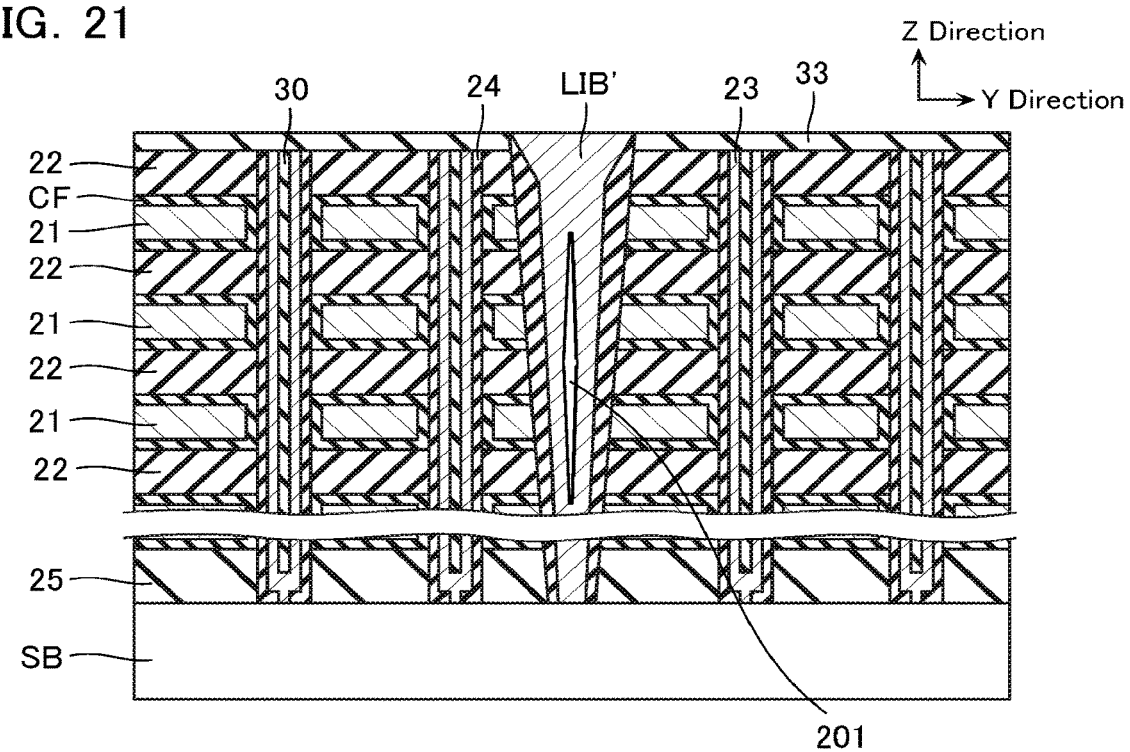
FIG. 21 is a cross-sectional view showing a manufacturing step of the nonvolatile semiconductor memory device in the comparative example.

FIG. 21 is a cross-sectional view for explaining a method of manufacturing of the comparative example. In the method of manufacturing of the comparative example, implanting of tungsten (W) as the source contact LIB' is performed in an unchanged state of FIG. 16, without performing the manufacturing step of forming the second insulating layer 210 previously mentioned in FIG. 17, and then excess tungsten (W) is removed by CMP. FIG. 21 is a cross-sectional view showing a manufacturing step of this stage. As shown in FIG. 21, the implanted tungsten (W) is shown as the source contact LIB' and its upper portion extends in a horn shape.

Subsequently, a manufacturing step for connecting the bit line BL and the source line SL is performed, and a structure in which the memory hole MH is connected to the bit line BL, of the kind shown in FIG. 20, is obtained.

Moreover, in the source contact LIB' of the comparative example, the opening op2 is still broad at the stage of FIG. 16. When tungsten (W) is supplied in this state, the inside of the opening op2 is filled with tungsten (W), without the void 201 being formed. Therefore, in the comparative example, sufficient relief of stress distortion of the memory string MS cannot be expected.

Figure 22:
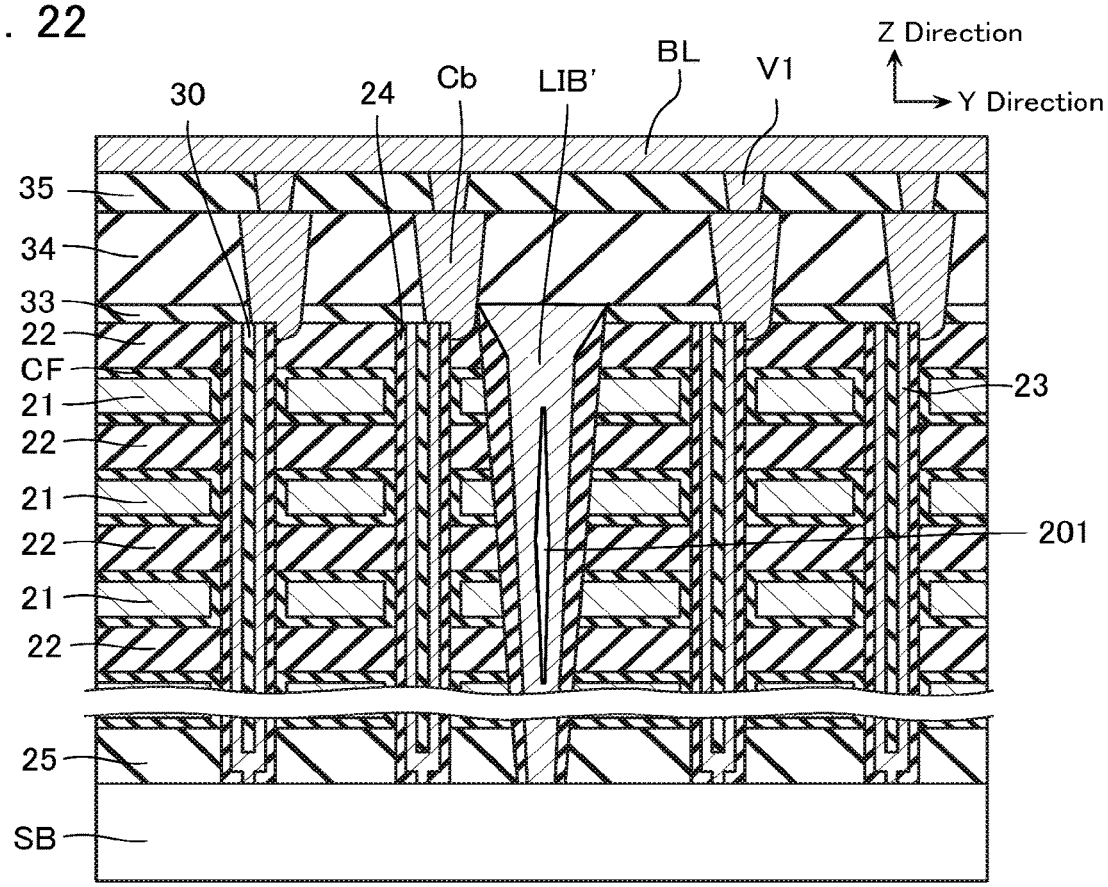
FIG. 22 is a schematic cross-sectional view for explaining a phenomenon that may occur in a manufacturing step of the nonvolatile semiconductor memory device in the comparative example.

Furthermore, in the present comparative example, when miniaturization of the semiconductor memory device has advanced, the following problem occurs. That is, when miniaturization advances, generally, a pitch between wiring lines or contacts narrows. Now, in the case that, for example, when forming the contact Cb for connection to the semiconductor layer 23, the contact Cb has undergone even a slight positional misalignment from a desired position in a source contact LIB' direction, there is a possibility of the contact Cb contacting the source contact LIB', as shown in FIG. 22. This is because the source contact LIB' of the comparative example has a horn shape, hence it is easy for the upper portion of the source contact LIB' and the contact Cb to contact each other.

In contrast, in the present embodiment, the source contact upper portion LIt has a diamond shape, hence its tip portion narrows and does not extend as in the comparative example. Therefore, the present embodiment has an advantage of avoiding a product defect such as short-circuiting occurring due to deterioration of manufacturing step accuracy.

[Others]

While a certain embodiment has been described, this embodiment has been presented by way of example only, and is not intended to limit the scope of the inventions. Indeed, the novel method and system described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The present embodiment describes a mode in which a lower end of the memory hole MH contacts the upper surface of the semiconductor substrate SB. However, the advantage of the shape of the contact according to the present embodiment is exactly the same even in a mode where the lower end of the memory hole MH is embedded inside the semiconductor substrate SB, and the shape of the contact is obviously not limited to that described in the present embodiment.

Moreover, in a mode according to the present embodiment, a plate-like shape parallel to the XZ plane was mentioned as the shape of the source contact LI. However, the advantage of the shape of the contact according to the present embodiment is exactly the same even when the source contact LI is isolated in the X direction and has a columnar structure, and the advantage of the shape of the contact in the present embodiment is obviously not limited to the present embodiment.

What is claimed is:

1. A method of manufacturing a semiconductor memory device, the semiconductor memory device comprising a memory string that comprises a plurality of memory cells connected in series, and the semiconductor memory device comprising a contact electrically connected to one end of the memory string, the method comprising:
    forming a memory string that penetrates a stacked body, the stacked body including, stacked on a substrate, a plurality of control gate electrodes and an inter-layer insulating layer positioned between the plurality of control gate electrodes;
    depositing a first insulating layer on the stacked body;
    forming a first opening that penetrates the first insulating layer and the stacked body;
    depositing a second insulating layer on the first insulating layer, such that the first opening is not blocked and such that in an upper portion of the first opening, a width of a second portion is larger than a width of a first portion positioned more upwardly than is the second portion; and
    the first opening is implanted with a conductive layer to form the contact.

2. The method of manufacturing a semiconductor memory device according to claim 1, wherein
    the conductive layer is implanted such that a void is formed on the inside of the first opening.

3. The method of manufacturing a semiconductor memory device according to claim 2, wherein
    the conductive layer is implanted such that an upper end of the void exists more to an upper side than does an upper end of the memory string.

4. The method of manufacturing a semiconductor memory device according to claim 1, wherein
    the conductive layer is tungsten (W).

5. The method of manufacturing a semiconductor memory device according to claim 1, wherein
    the first opening has a plate-like shape extending in a third direction perpendicular to the substrate and a first direction along the substrate.

6. The method of manufacturing a semiconductor memory device according to claim 1, further comprising
    after implanting the conductive layer, removing the first insulating layer and the second insulating layer by executing a CMP method.

7. The method of manufacturing a semiconductor memory device according to claim 6, wherein
    the conductive layer is implanted such that a void is formed on the inside of the first opening.

8. The method of manufacturing a semiconductor memory device according to claim 7, wherein
    the conductive layer is implanted such that an upper end of the void exists more to an upper side than does an upper end of the memory string.

9. The method of manufacturing a semiconductor memory device according to claim 6, wherein
    the conductive layer is tungsten (W).

10. The method of manufacturing a semiconductor memory device according to claim 6, wherein
    the first opening has a plate-like shape extending in a third direction perpendicular to the substrate and a first direction along the substrate.

* * * * *